(12) United States Patent
Clevenger et al.

(10) Patent No.: US 10,347,617 B2
(45) Date of Patent: Jul. 9, 2019

(54) SELF-ALIGNED THREE DIMENSIONAL CHIP STACK AND METHOD FOR MAKING THE SAME

(71) Applicants: International Business Machines Corporation, Armonk, NY (US); STMicroelectronics, Inc., Coppell, TX (US)

(72) Inventors: Lawrence A. Clevenger, Rhinebeck, NY (US); Carl J. Radens, LaGrangeville, NY (US); Yiheng Xu, Hopewell Junction, NY (US); John H. Zhang, Altamont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/695,198

(22) Filed: Sep. 5, 2017

(65) Prior Publication Data

US 2017/0365590 A1    Dec. 21, 2017

Related U.S. Application Data

(62) Division of application No. 14/956,834, filed on Dec. 2, 2015, now Pat. No. 9,837,394.

(51) Int. Cl.
*H01L 21/44* (2006.01)
*H01L 21/48* (2006.01)
(Continued)

(52) U.S. Cl.
CPC .......... *H01L 25/18* (2013.01); *H01L 21/4846* (2013.01); *H01L 23/13* (2013.01);
(Continued)

(58) Field of Classification Search
CPC ..... H01L 25/18; H01L 21/4846; H01L 25/50; H01L 23/5389; H01L 23/49827;
(Continued)

(56) References Cited

U.S. PATENT DOCUMENTS

| | | | | |
|---|---|---|---|---|
| 5,646,828 A | * | 7/1997 | Degani | ................... H01L 23/13 |
| | | | | 257/707 |
| 5,869,896 A | * | 2/1999 | Baker | ................... H01L 25/065 |
| | | | | 257/680 |
| 2013/0236989 A1 | * | 9/2013 | Ranjan | .............. H01L 21/02063 |
| | | | | 438/5 |

OTHER PUBLICATIONS

Lawrence A. Clevenger, et al., Pending U.S. Appl. No. 14/956,834, entitled "Self-Aligned Three Dimensional Chip Stack and Method for Making the Same," filed Dec. 2, 2015.
(Continued)

*Primary Examiner* — Jami Valentine Miller
*Assistant Examiner* — Dilinh P Nguyen
(74) *Attorney, Agent, or Firm* — Cantor Colburn LLP; Steven Meyers

(57) ABSTRACT

Self-aligned three dimensional vertically stacked chip stacks and processes for forming the same generally include two or more vertically stacked chips supported by a scaffolding structure, the scaffolding structure defined by a first scaffolding trench and at least one additional scaffolding trench, the first scaffolding trench comprising a bottom surface having a width and a sidewall having a height extending from the bottom surface to define a lowermost trench in a scaffolding layer, the at least one additional scaffolding trench overlaying the first scaffolding trench having a sidewall having a height and a width, wherein the width of the at least one scaffolding trench is greater than the first scaffolding trench width to define a first stair between the first scaffolding trench and the at least one additional trench; a first chip secured to the first scaffolding trench having a
(Continued)

height less than the first scaffolding trench sidewall height; and at least one additional chip secured to and supported by the first stair, wherein the at least one additional chip is vertically spaced apart from the first chip.

11 Claims, 10 Drawing Sheets

(51) Int. Cl.

| | | |
|---|---|---|
| *H01L 23/02* | (2006.01) | |
| *H01L 25/18* | (2006.01) | |
| *H01L 25/065* | (2006.01) | |
| *H01L 23/538* | (2006.01) | |
| *H01L 23/31* | (2006.01) | |
| *H01L 23/498* | (2006.01) | |
| *H01L 25/00* | (2006.01) | |
| *H01L 23/13* | (2006.01) | |
| *H01L 23/15* | (2006.01) | |

(52) U.S. Cl.
CPC .......... *H01L 23/15* (2013.01); *H01L 23/3107* (2013.01); *H01L 23/49827* (2013.01); *H01L 23/49894* (2013.01); *H01L 23/5389* (2013.01); *H01L 25/0657* (2013.01); *H01L 25/50* (2013.01); *H01L 2224/32145* (2013.01); *H01L 2224/32225* (2013.01); *H01L 2225/06541* (2013.01); *H01L 2225/06548* (2013.01); *H01L 2225/06555* (2013.01); *H01L 2225/06568* (2013.01); *H01L 2225/06572* (2013.01); *H01L 2225/06589* (2013.01); *H01L 2225/06593* (2013.01); *H01L 2924/1433* (2013.01); *H01L 2924/1434* (2013.01); *H01L 2924/1436* (2013.01); *H01L 2924/1438* (2013.01); *H01L 2924/157* (2013.01); *H01L 2924/15156* (2013.01); *H01L 2924/15313* (2013.01)

(58) Field of Classification Search
CPC ..... H01L 23/13; H01L 23/15; H01L 25/0657; H01L 23/49894; H01L 23/3107; H01L 2225/06555; H01L 2225/06548; H01L 2225/06572; H01L 2224/1302; H01L 2224/141; H01L 2224/161; H01L 2224/171; H01L 2224/211; H01L 2224/2902; H01L 2224/301; H01L 2224/321; H01L 2224/331; H01L 2224/401; H01L 2224/411; H01L 2224/4502; H01L 2224/481; H01L 2224/491; H01L 23/49838; H01L 25/117; H01L 25/043; H01L 25/074; H01L 25/0756; H01L 25/041; H01L 25/065; H01L 25/07; H01L 25/165
USPC ........ 257/686, 777, 723, 786; 438/109, 107, 438/110, 612, 666
See application file for complete search history.

(56) References Cited

OTHER PUBLICATIONS

List of IBM Patents or Patent Applications Treated as Related; (Appendix P), Date Filed Sep. 5, 2017; 2 pages.
Lawrence A. Clevenger, et al., Pending U.S. Appl. No. 15/802,525, entitled "Self-Aligned Three Dimensional Chip Stack and Method for Making the Same," filed Nov. 3, 2017.
Lawrence A. Clevenger, et al., Pending U.S. Appl. No. 15/802,541, entitled "Self-Aligned Three Dimensional Chip Stack and Method for Making the Same," filed Nov. 3, 2017.
List of IBM Patents or Patent Applications Treated as Related; (Appendix P), Date Filed Nov. 3, 2017; 2 pages.

* cited by examiner

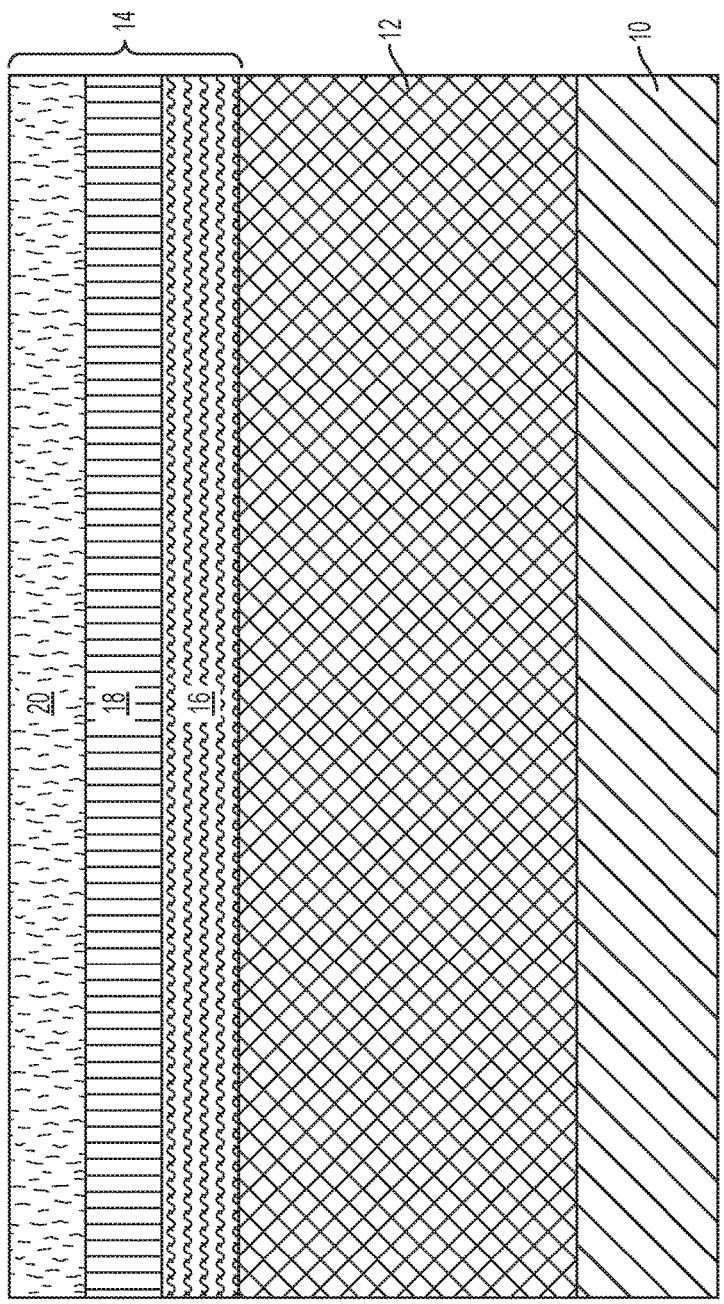

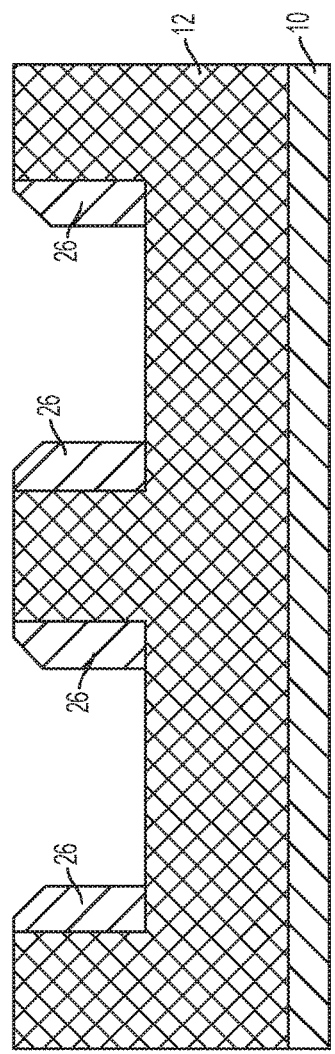
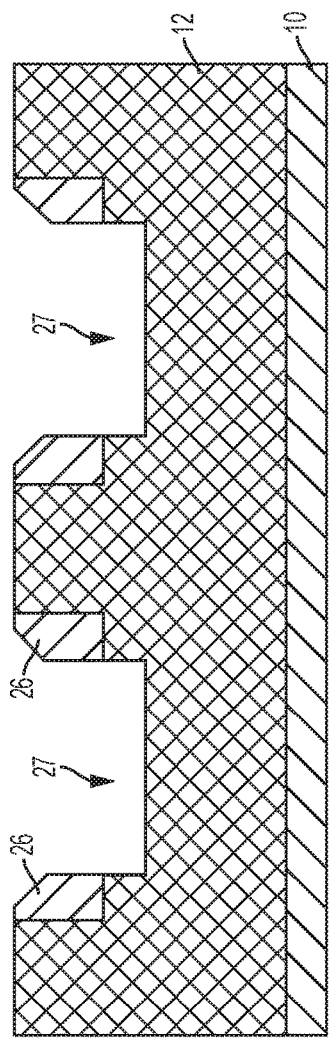

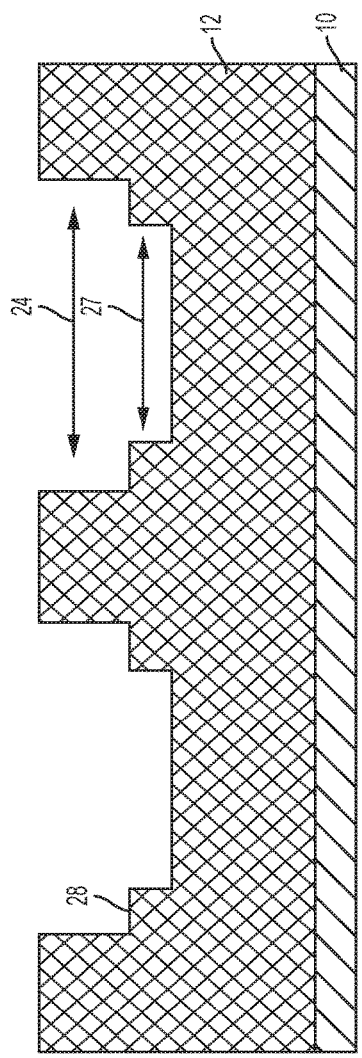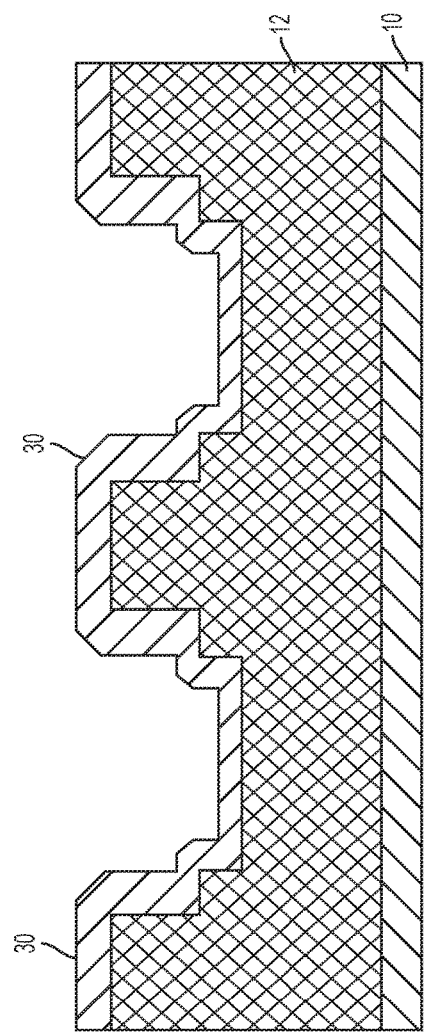

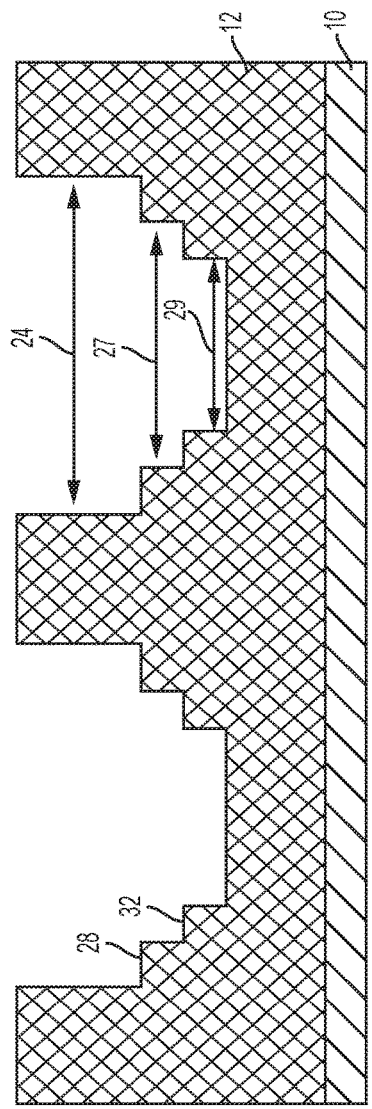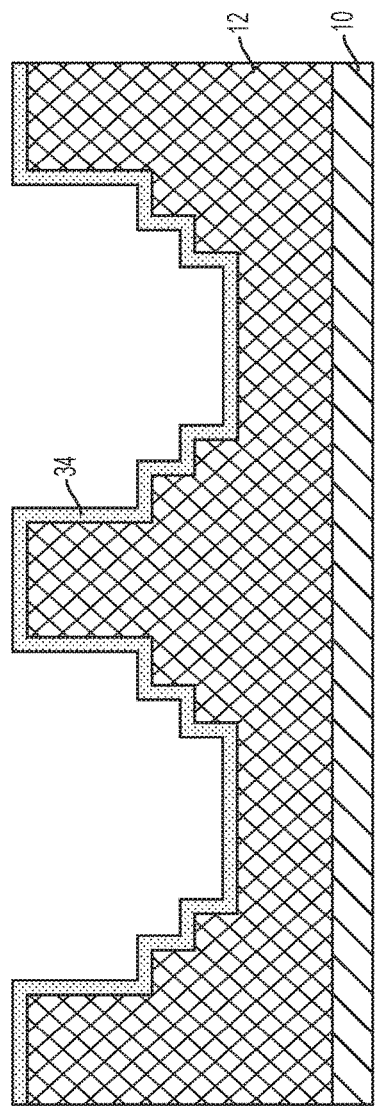

US 10,347,617 B2

SELF-ALIGNED THREE DIMENSIONAL CHIP STACK AND METHOD FOR MAKING THE SAME

DOMESTIC PRIORITY

This application is a DIVISIONAL of U.S. Non-Provisional application Ser. No. 14/956,834, filed Dec. 2, 2015, which is incorporated herein by reference in its entirety.

BACKGROUND

The present invention generally relates to integrated circuit fabrication, and more particularly, to a self-aligned three-dimensional chip stack and method for making the same.

A three-dimensional package (System in Package, Chip Stack MCM, etc.) contains two or more chips (integrated circuits) stacked vertically so that they occupy less space and/or have greater connectivity. The three-dimensional stack is driven by the strong demand for high speed, high density, small size, and multifunctional electronic devices. When this stack technology is applied in the field of memory devices, it is possible to realize a packaged product having the memory capacity more than two times the memory capacity of an unpackaged chip, for example, and thus it is possible to increase the efficiency of the mounting area usage.

SUMMARY

The present disclosure is directed to three dimensional chip stacks and processes of forming self-aligned three dimensional vertical chip stacks. In one embodiment, a three dimensional vertical chip stack comprises two or more vertically stacked chips supported by a scaffolding structure, the scaffolding structure defined by a first scaffolding trench and at least one additional scaffolding trench, the first scaffolding trench comprising a bottom surface having a width and a sidewall having a height extending from the bottom surface to define a lowermost trench in a scaffolding layer, the at least one additional scaffolding trench overlaying the first scaffolding trench having a sidewall having a height and a width, wherein the width of the at least one scaffolding trench is greater than the first scaffolding trench width to define a first stair between the first scaffolding trench and the at least one additional trench; a first chip secured to the first scaffolding trench having a height less than the first scaffolding trench sidewall height; and at least one additional chip secured to and supported by the first stair, wherein the at least one additional chip is vertically spaced apart from the first chip, wherein the first chip and the at least one additional chip are each self-aligned within the first scaffolding trench and the at least one additional scaffolding trench, respectively.

In another embodiment, a three dimensional vertical chip stack comprises two or more vertically stacked chips supported by a scaffolding structure, the scaffolding structure defined by a first scaffolding trench and at least one additional scaffolding trench, the first scaffolding trench comprising a bottom surface having a width and a sidewall having a height extending from the bottom surface to define a lowermost trench in a scaffolding layer, the at least one additional scaffolding trench overlaying the first scaffolding trench having a sidewall having a height and a width, wherein the width of the at least one scaffolding trench is greater than the first scaffolding trench width to define a first stair between the first scaffolding trench and the at least one additional trench; a first chip secured to the first scaffolding trench having a height less than the first scaffolding trench sidewall height; and at least one additional chip secured to and supported by the first stair, wherein the at least one additional chip is vertically spaced apart from the first chip by an interposer, wherein the first chip and the at least one additional chip are each self-aligned within the first scaffolding trench and the at least one additional scaffolding trench, respectively.

A process of forming a self-aligned three dimensional vertical chip stack, comprises forming a first scaffolding trench in an elastic scaffolding layer, the first scaffolding trench defined by a bottom surface have a width and sidewalls extending from the bottom surface to define a height; forming at least one additional scaffolding trench in the first scaffolding trench, the at least one additional scaffolding trench having a width less than the first scaffolding trench width to define a stair therebetween; depositing an adhesive liner in the at least one additional scaffolding trench and the first scaffolding trench; depositing a first chip in the first scaffolding trench, the first chip having a height less than the sidewall height of the first scaffolding height; depositing at least one additional chip in the at least one additional scaffolding trench, the at least one additional chip having a height less than the sidewall height of the at least one additional scaffolding height, wherein the at least one additional chip is vertically spaced apart from the first chip, and wherein the first chip and the at least one additional chip are each self-aligned within the first scaffolding trench and the at least one additional scaffolding trench, respectively.

BRIEF DESCRIPTION OF THE DRAWINGS

FIG. 1C depicts a schematic cross-sectional view illustrating the structure of FIG. 1B after formation of a lithographic structure onto the scaffolding layer including a developable optical planarization layer (OPL) on the scaffolding layer, a developable anti-reflective coating (ARC) layer on the developable OPL, and a photoresist layer on the developable ARC layer;

FIG. 1G depicts a schematic cross-sectional view illustrating the structure of FIG. 1F after a reactive ion etch process configured to stop at the scaffolding layer;

FIG. 1H depicts a schematic cross-sectional view illustrating the structure of FIG. 1G after a trench etch of the scaffolding layer is performed;

FIG. 1I depicts a schematic cross-sectional view illustrating the structure of FIG. 1H followed by selective removal of the spacer to form a second scaffolding trench including a first stair;

FIG. 1J depicts a schematic cross-sectional view illustrating the structure of FIG. 1I after formation of conformal spacer layer on the first and second scaffolding trench structure;

FIG. 1M depicts a schematic cross-sectional view illustrating the structure of FIG. 1L followed by selective removal of the spacer to form a second scaffolding trench including a second stair;

FIG. 1N depicts a schematic cross-sectional view illustrating the structure of FIG. 1M after deposition of a liner layer;

DETAILED DESCRIPTION

In microelectronics, a "three dimensional integrated circuit" (3D IC) is an integrated circuit manufactured by stacking silicon wafers and/or dies and interconnecting them vertically using through-silicon vias (TSVs) so that they behave as a single device to achieve performance improvements at reduced power and smaller footprint than conventional two dimensional processes. As used herein, the terms "die" and "chip" are synonymous, and may be used interchangeably. Generally, a "die" may refer to a rectangular fragment of a semiconductor wafer.

3D IC is just one of a host of 3D integration schemes that exploit the z-direction to achieve electrical performance benefits. As technology nodes continue to shrink in size, the chips continue to get smaller and smaller. However, as the chips shrink in size heat buildup within the stack becomes more of an issue and must be dissipated. Moreover, alignment for the through silica via can be a bottle neck as the density increases. In the present disclosure, 3D stacks are assembled using nano-assembly scaffoldings, wherein the scaffolding is configured to locally hold and align the chips within the scaffolding structure and provide sufficient space between vertically arranged chips effective for heat dissipation. The patterned scaffoldings can be flexibly connected with each other with both active and passive components built in and compatible with CMOS processing.

Figure 1A:
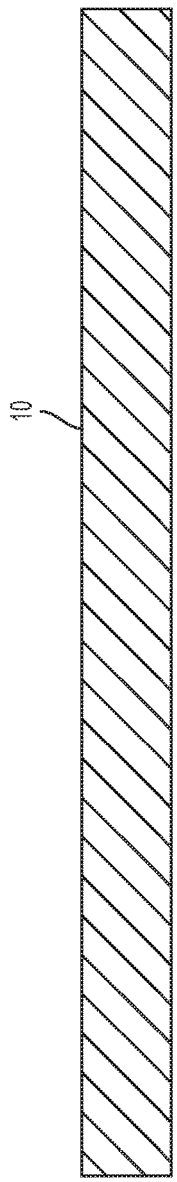
FIG. 1A depicts a schematic cross-sectional view illustrating an anchor pad layer utilized to fabricate the three dimensional disc stack according to an embodiment of the present invention.

The present disclosure provides a process and scaffolding structure for self-aligned chip placement within a 3D IC stack and at a defined distance from other chips within the stack for effective heat dissipation. With reference now to FIG. 1A, the structure and process for making the structure begins with deposition of an anchor pad 10 formed on and/or defined by the die pad thereof. Such anchor pad(s) may be provided in any one of a multiplicity of different pad shapes, and are adapted to satisfy the required mechanical anchoring and thermal dissipation thresholds for the package, while still enabling high density circuit routing. The anchor pad may comprise copper with a nickel/gold surface, for an example embodiment. However, this is merely an example of an anchor pad, and the scope of claimed subject matter is not limited in this respect. The thickness of the anchor pad generally ranges from 10 nanometers (nm) to 50 microns (μm).

Figure 1B:
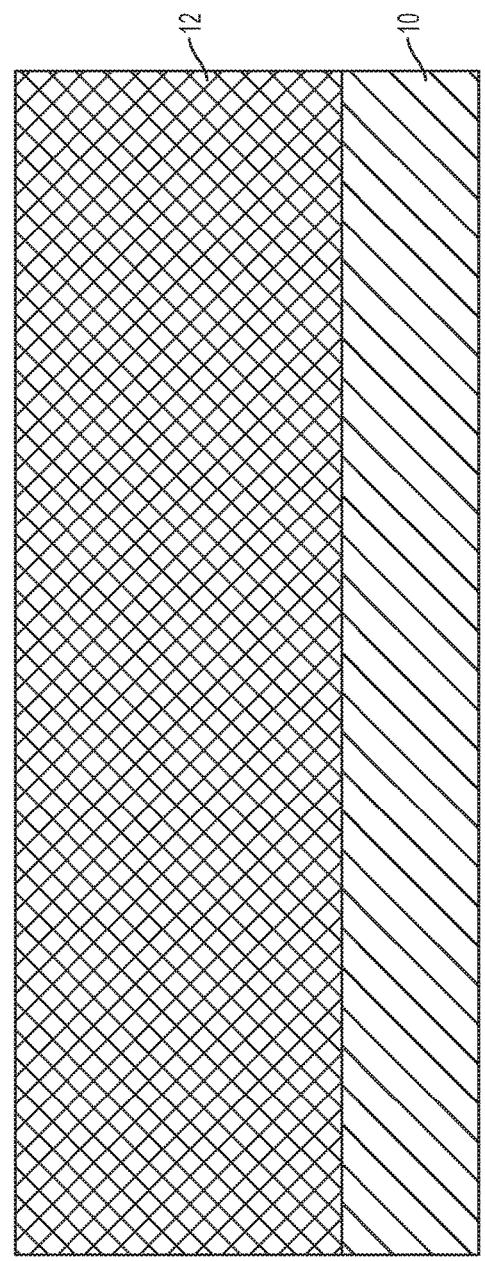
FIG. 1B depicts a schematic cross-sectional view illustrating the structure of FIG. 1A after formation of an elastic scaffolding layer.

In FIG. 1B, a scaffolding layer 12 is deposited onto the anchor pad at a thickness of 80 nm to 200 μm. The thickness of the scaffolding layer generally depends on the number of stacked devices in the stack. The scaffolding layer is formed of an elastic material. Suitable elastic materials include, without limitation, silicon carbide, sapphire, and the like.

In FIG. 1C, a lithographic structure 14 is deposited onto the scaffolding layer 12 including a developable optical planarization layer (OPL) 16 on the scaffolding layer 12, a developable anti-reflective coating (ARC) layer 18 on the developable OPL 16, and a photoresist layer 20 on the developable ARC layer 18. The photoresist layer 20 is exposed to an image pattern using a photolithographic system and developed with a suitable developer to form a scaffolding trench lithographically pattern. The pattern is then transferred to the underlying ARC layer to form an ARC pattern.

The developable OPL layer 16 may be comprised of a variety of different materials and it may be formed using a variety of known techniques. Suitable examples include, but are not limited to, a photo-sensitive organic polymer comprising a light-sensitive material that, when exposed to electromagnetic (EM) radiation, is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the developable OPL 16 may comprise any organic polymer and a photo-active compound having a molecular structure that can attach to the molecular structure of the organic polymer. The fabrication of a photo-sensitive organic polymer is understood to one skilled in the art of organic chemistry or polymer chemistry. For example, the OPL layer 16 may be a layer of CHM701B, commercially available from Cheil Chemical Co., Ltd., HM8006 and HM8014, commercially available from JSR Corporation, and ODL-102, commercially available from ShinEtsu Chemical, Co., Ltd. The OPL layer may be formed by performing a spin-coating process and thereafter drying the OPL material. Furthermore, the developable OPL 16 is selected to be compatible with the overlying developable ARC layer 18, the overlying photo-resist layer 20 and the lithographic wavelength, i.e., ArF, KrF, etc. The developable OPL 16 may, for example, be applied using spin coating technology.

The developable ARC layer 18 possesses material properties suitable for use as an anti-reflective coating. Additionally, the developable ARC layer comprises a light-sensitive material that, when exposed to electromagnetic (EM) radiation, is chemically altered and thus configured to be removed using a developing solvent. For example, the developable ARC layer may comprise (wet) developable anti-reflective coatings commercially available from Brewer Science. Inc. (2401 Brewer Drive, Rolla, Mo. 65401). Additionally, the developable ARC layer is selected to be compatible with the overlying photo-resist layer and the lithographic wavelength, i.e., ArF, KrF, etc. The developable ARC layer may, for example, be applied using spin coating technology.

The photoresist layer 20 may comprise 248 nm (nanometer) resists, 193 nm resists, 157 nm resists, or EUV (extreme ultraviolet) resists. The photoresist layer 20 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

The photoresist layer 20, the developable ARC layer 18 and the developable OPL 16 are imaged with an image pattern. The exposure to EM radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). The exposure extends through the entire thickness of the photoresist layer 20, the developable ARC layer 18 and the developable OPL 16.

Figure 1D:
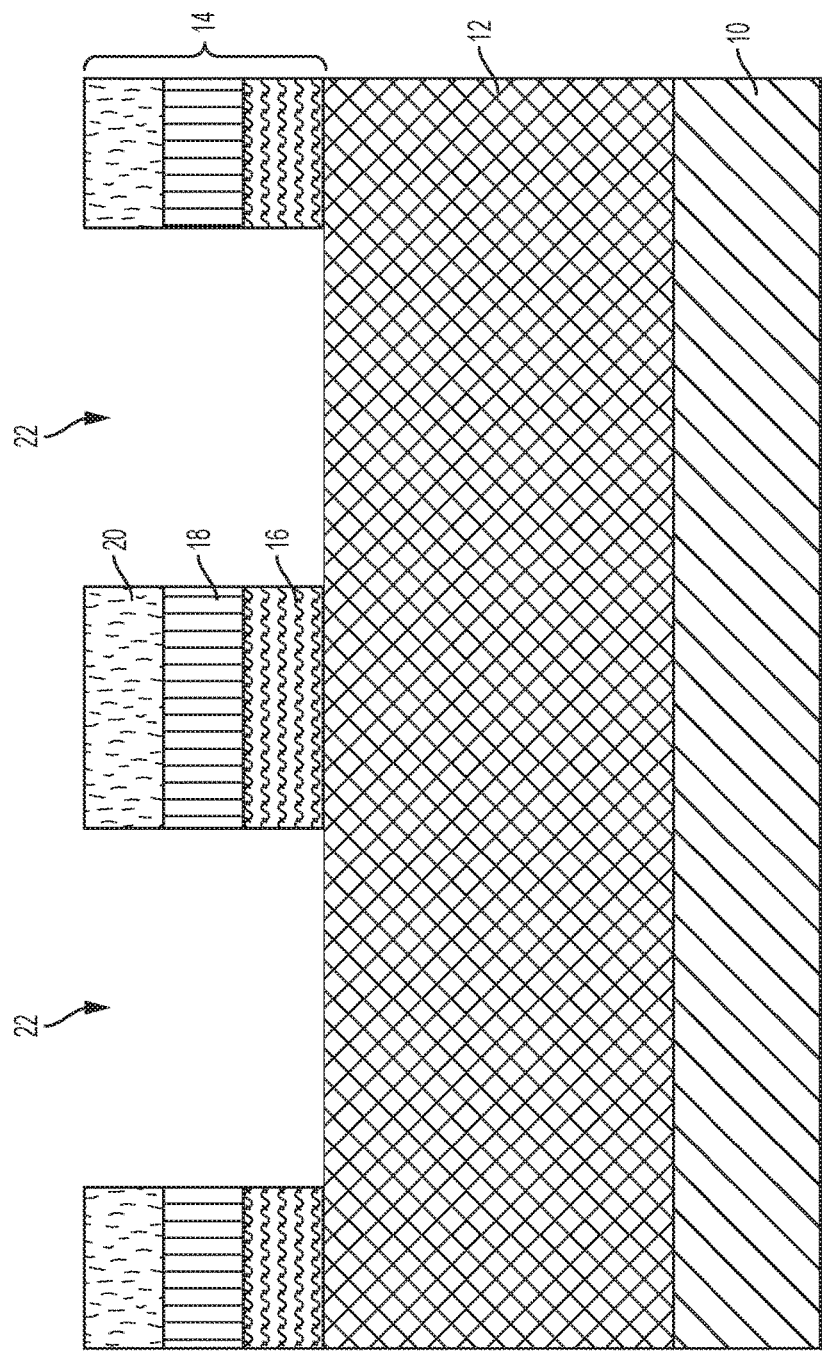
FIG. 1D depicts a schematic cross-sectional view illustrating the structure of FIG. 1C after formation of a pattern in the lithographic structure.

The exposed photo-resist layer 20, the exposed developable ARC layer 18, and the exposed developable OPL 16 are the subjected to a developing process in order to remove the image pattern and form a trench pattern 22 as shown in FIG. 1D. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

Figure 1E:
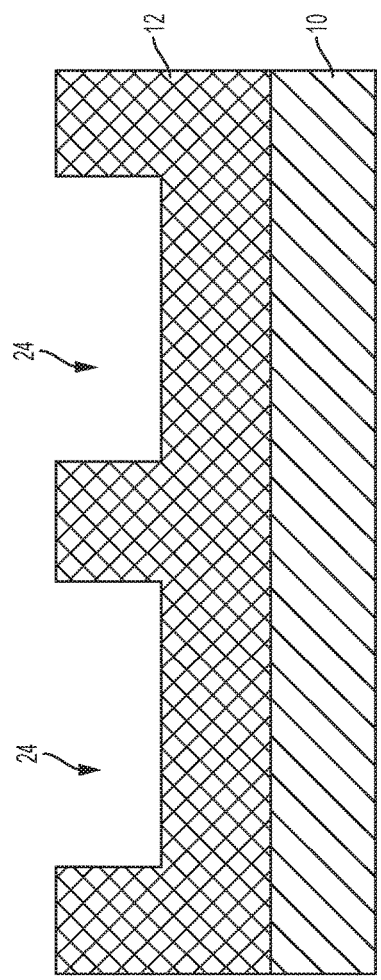
FIG. 1E depicts a schematic cross-sectional view illustrating the structure of FIG. 1D after pattern transfer of the lithographic structure pattern in the scaffolding layer, thereby forming a first scaffolding trench layer.

As shown in FIG. 1E, following completion of the trench pattern 22 in the lithographic structure 14, a reactive ion etch may be performed to transfer pattern 22 into the scaffolding layer 12 so as to form the first scaffolding trench layer 24. The remaining lithographic structure 14 is then removed using, for example, a wet stripping process, a dry plasma ashing process, a dry non-plasma ashing process, one or more etching processes, or combinations thereof. The one or more etching processes may include any combination of wet or dry etching processes. The dry etching processes may include dry plasma etching processes or dry non-plasma etching processes.

Figure 1F:
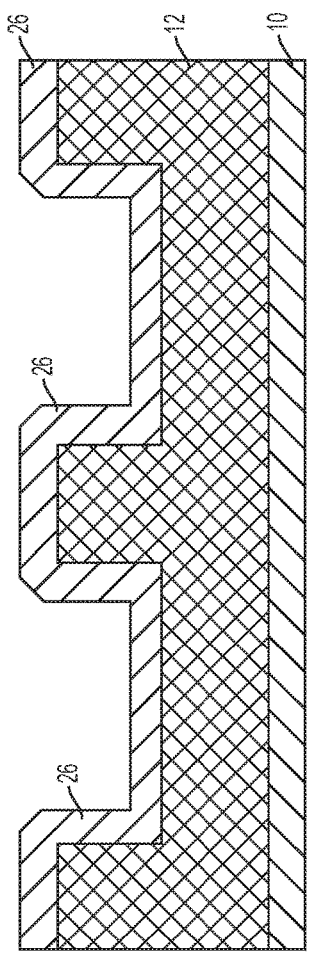
FIG. 1F depicts a schematic cross-sectional view illustrating the structure of FIG. 1E after formation of conformal spacer layer on the first scaffolding trench layer.
Figure 1K:
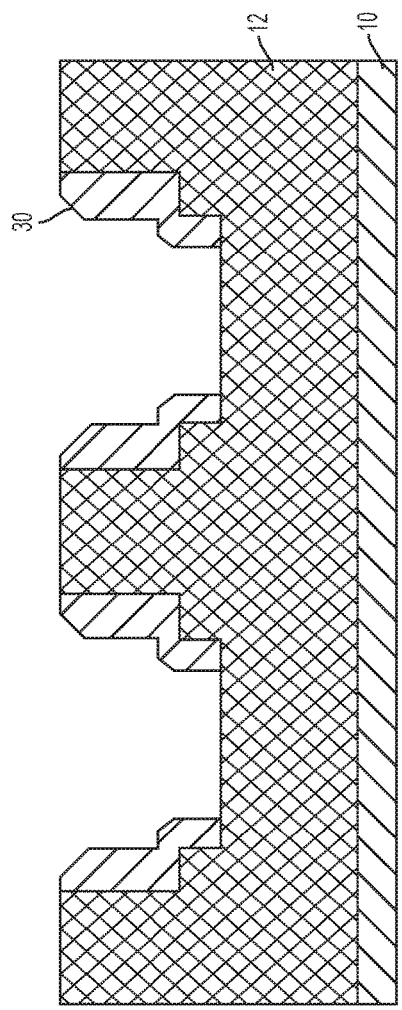
FIG. 1K depicts a schematic cross-sectional view illustrating the structure of FIG. 1J after a reactive ion etch process configured to stop at the scaffolding layer.

In FIG. 1F, a conformal spacer layer 26 is deposited over the now patterned scaffolding layer 12. The spacer layer 26 may be formed by depositing tetraethylorthosilicate (TEOS), oxy-nitride-oxide, silicon nitride, diamond, and/or other dielectric materials over the substrate.

In FIG. 1G, a reactive ion etch process is performed to form the spacer material on the sidewalls of the first scaffolding trench 12.

Using the spacer 26 as a hard mask, a trench etch of the scaffolding layer 12 is performed followed by selective removal of the spacer to form a second scaffolding trench 27 including a first stair 28 as shown in FIGS. 1H-I. The trench etch and selective removal of the spacer can be performed using a reaction ion etching process.

Figure 1L:
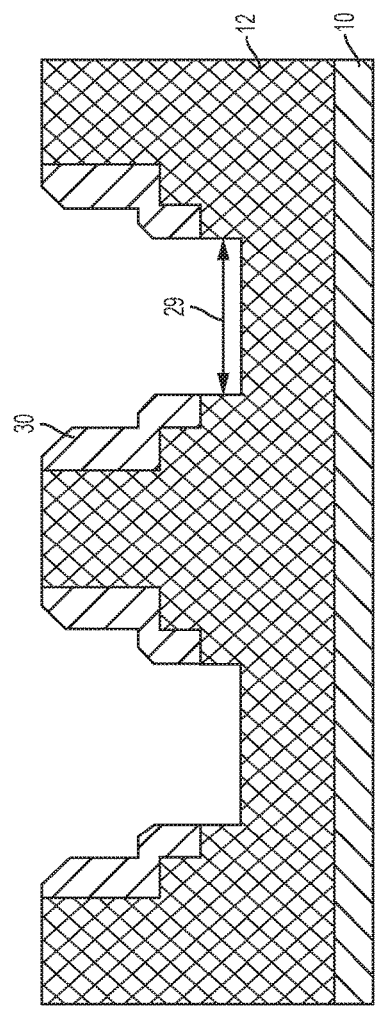
FIG. 1L depicts a schematic cross-sectional view illustrating the structure of FIG. 1K after a trench etch of the scaffolding layer is performed.

The above process is repeated to form an additional stair. A spacer layer 30 is conformally deposited onto the topography previously defined in the scaffolding layer 12 as shown in FIG. 1J. An anisotropic etch such as a reactive ion etch process is then employed to remove a portion of the spacer as shown in Fig. IK. Then, using the remaining spacer 30 as a hard mask on the sidewalls of the trench structure, a trench etch of the scaffolding layer is performed followed by selective removal of the spacer to form a third scaffolding trench 29 including a second stair 32 as shown in FIGS. 1L-M. The trench etch and selective removal of the spacer can be performed using an anisotropic etch process such as a reaction ion etching process. Similar to the width, the particular stair height can be selected depending on the dimension of the intended stacked device. The process can be repeated as desired to provide multiple stairs.

Once the desired number of stairs is fabricated, an adhesive liner layer 34 is deposited as shown in FIG. 1N. The liner layer is selected from electrically insulating materials, which may include an epoxy adhesive. As will be described in more detail below, each chip in the three dimensional stack can be self-aligned by being seated on a desired stair, e.g., stair 28, stair 32, or the like, with the proviso that the stair height (h1) is greater than the chip height (h2) for forming a three dimensional stack structure as shown more clearly in FIG. 2 below.

Figure 2:
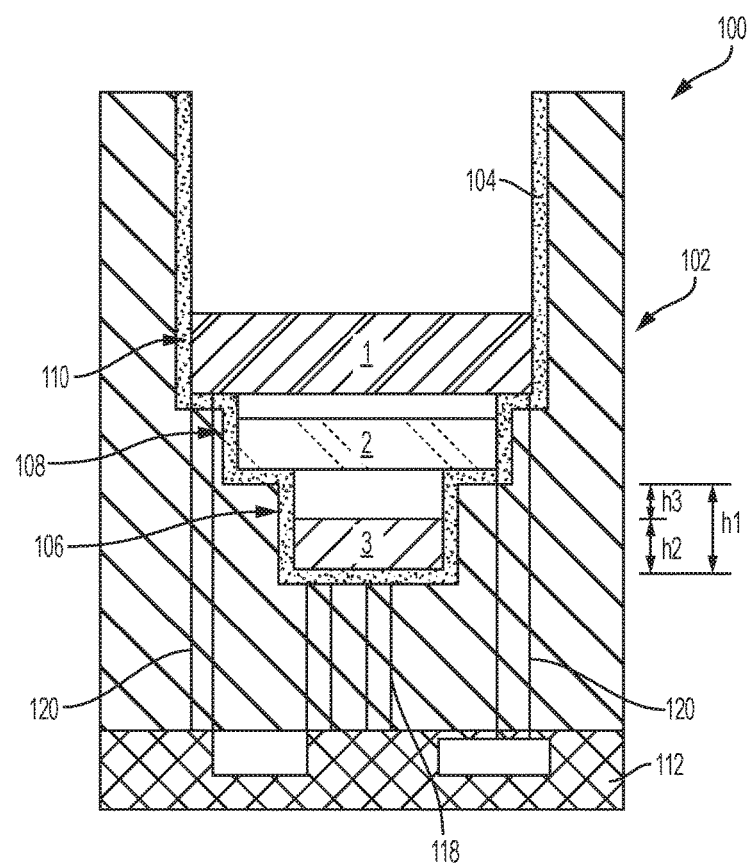
FIG. 2 depicts a schematic cross-sectional view illustrating a three dimensional disk stack in accordance with one embodiment.

In FIG. 2, there is shown a cross sectional view of an exemplary three dimensional chip stack 100 including three vertically stacked chips, 1, 2, and 3 in accordance with an embodiment. The present invention is not intended to be limited to the particular number of vertically stacked chips and generally includes at least two vertically stacked chips. It should be apparent that three dimensional chip stacks including more than three vertically stacked chips can be formed provided there are recessed portions in the forms of stairs to provide self-alignment and securement within the vertical chip stack.

The illustrated three chips can have the same or different functionality. Examples of the types of chips that may be incorporated into a chip stack may include, but are not limited to, flash memory chips, dynamic random access memory (DRAM) chips, application specific integrated circuit (ASIC) chips, etc. Likewise, the different chips can have the same or different dimensions with the following provision: each stair formed within the scaffolding structure has a defined height (h1) as shown. The chip that is self-aligned in the particular stair has a height (h2) that is less than stair height (h1). By doing so, the chips are spacedly stacked apart from one another by a controlled space height (h3), which can be optimized to provide effective heat dissipation during use thereof while also providing maximum chip density.

The bottommost chip 3 will be secured via an adhesive liner 104 to the lowermost trench structure 106 within the scaffolding structure 102. Each succeeding chip, e.g., 1 or 2, in the vertical stack will be self-aligned to a different stair defined by a scaffolding trench structure, e.g., 108, 110 such that the chips 1, 2, 3 are staggered at least with respect to a stair defined by the scaffold trench structure. The succeeding chip may be further optimized by depositing a defined thickness of the adhesive liner material onto the step so as to increase the spacing distance (h3) between chips.

The vertically stacked chips 1, 2, 3 utilize through-silicon-vias (TSV) to pass signals from the anchor pad layer 112 to one chip or another. As used herein, the term "through-silicon-via", as well as its abbreviation TSV, is meant to include any vertical electrical connection passing substantially completely through a silicon wafer, die, or chip. In this manner, the vertically stacked and self-aligned chips 1, 2, 3 are vertically interconnected using TSV so that they behave as a single device.

In one embodiment, the lowermost chip, i.e., chip 3, can be vertically interconnected directly through its body using TSV 118 as shown whereas chips 1 and 2 can be vertically interconnected using TSV 120 wired along their edges. Again, the stair height (h1) is configured to be greater than the chip height (h2) such that an empty space defined by the height difference (h3) is provided.

The via holes for forming the various TSVs 118, 120 may be formed using any technique now known or to be developed in the future, for one or more embodiments. For one example embodiment, the various holes may be formed by a Deep Reactive Ion Etching (DRIE) process, including spinning a layer of photoresist material onto the surface of the wafer, and exposing and developing the photoresist to define the areas to be drilled. For another embodiment, a laser drilling method may be utilized. However, these are merely example techniques for creating the various holes, and the scope of claimed subject matter is not limited in these respects.

The via holes may be filled with an electrically conductive material. For one example, the holes may be filled with copper. For another example embodiment, the holes may be filled with polysilicon. Other example materials that may be used include, but are not limited to, gold, solder, tungsten, conductive paste, etc. However, these are merely example electrically conductive materials, and the scope of claimed subject matter is not limited in this respect. For one or more embodiments, example techniques for depositing conductive material may include, but are not limited to, electroless plating, immersion plating, solder printing, conductive paste printing or dispensing, and electrolytic plating techniques. With the depositing of the electrically conductive material in via holes, TSVs are formed, with electrically conductive paths extending completely through a silicon layer from anchor pads.

Figure 3:
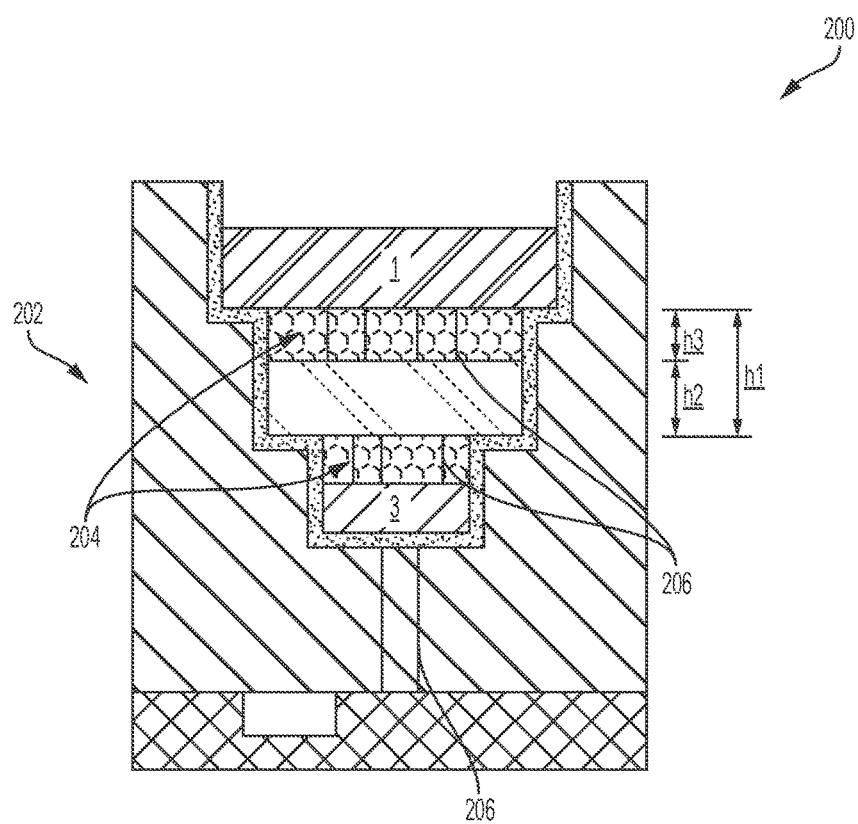
FIG. 3 depicts a schematic cross-sectional view illustrating a three dimensional disk stack in accordance with another embodiment.

In FIG. 3, there is shown a cross sectional view of an exemplary three dimensional chip stack 200 including three vertically stacked chips, 1, 2, and 3 in accordance with another embodiment. The three dimensional chip stack 200 includes a scaffolding structure 202 for self-alignment of the vertically stacked chips. As described previously, the chip height (h2) for a respective chip is less than the stair height (h1), which can be optimized to provide the desired amount of spacing between vertically stacked chips for effective heat dissipation at maximum chip density. The succeeding chip may be further optimized by depositing a defined thickness of the adhesive liner material onto the step so as to increase the spacing distance (h3) between chips.

In this embodiment, an interposer 204 is deposited into the space (h3) between the adjacent chips. The interposer 204 with a TSV 206 is an electrical interface routing between adjacent chip bodies. For one or more embodiments, interposer 204 may comprise silicon, although the scope of claimed subject matter is not limited in this respect. A silicon (Si) interposer with TSV has emerged as a good solution to provide high writing density interconnection, minimize coefficient of thermal expansion (CTE) mismatch between the die and the interposer, and improve electrical performance due to short interconnection from chip to the substrate.

The terminology used herein is for the purpose of describing particular methods and devices only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A process of forming a self-aligned three dimensional vertical chip stack, comprising:
    forming a first scaffolding trench in an elastic and non-conductive scaffolding layer, the first scaffolding trench defined by a bottom surface have a width and sidewalls extending from the bottom surface to define a first scaffolding height;
    forming at least one additional elastic and non-conductive scaffolding trench in the first scaffolding trench, the at least one additional elastic and non-conductive scaffolding trench having a width less than the first scaffolding trench width to define a stair therebetween;
    depositing a conformal non-conductive adhesive liner on surfaces defining the at least one additional elastic and no-conductive scaffolding trench and the first scaffolding trench;
    securing a first chip via the conformal non-conductive adhesive liner to the first scaffolding trench, the first chip having a height less than the first scaffolding height;
    securing at least one additional chip via the conformal non-conductive adhesive liner to the at least one additional elastic and non-conductive scaffolding trench, the at least one additional chip having a height less than a sidewall height of the at least one additional elastic and non-conductive scaffolding trench, wherein the at least one additional chip is vertically spaced apart from the first chip, and wherein the first chip and the at least one additional chip are each self-aligned within the first scaffolding trench and the at least one additional elastic and non-conductive scaffolding trench, respectively.

2. The process of claim 1, wherein forming the first and the at least one additional elastic and non-conductive scaffolding trench comprises depositing a lithographic structure onto the elastic scaffolding layer; lithographically patterning the lithographic structure, and transferring the pattern into the elastic scaffolding layer.

3. The process of claim 2, wherein the lithographic layer comprises a optical planarization layer on the scaffolding layer, an antireflective coating on the optical planarization layer, and a photoresist layer on the antireflective coating.

4. The process of claim 1, wherein the adhesive liner is an electrically insulating epoxy material.

5. The process of claim 1, further comprising forming a plurality of vias including a conductive material therein electrically connecting the first chip and the at least one additional chip.

6. The process of claim 5, wherein the vias including the conductive material electrically connect to a body of the first chip and at edges of the at least one additional chip.

7. The process of claim 1, wherein forming the first scaffolding trench comprises first defining an anchor pad on a substrate and forming the first scaffolding trench on the anchor pad.

8. The process of claim 7, wherein the anchor pad comprises copper.

9. The process of claim 1, further comprising depositing a flowable liquid within a sealed space defined by the vertical spacing between the first chip and the at least one additional chip.

10. The process of claim 1, wherein the first chip and the at least one additional chip are different.

11. The process of claim 1, wherein the first chip and the at least one additional chip comprise flash memory chips, dynamic random access memory (DRAM) chips, or application specific integrated circuit (ASIC) chips.

* * * * *

UNITED STATES PATENT AND TRADEMARK OFFICE
CERTIFICATE OF CORRECTION

Page 1 of 1

PATENT NO. : 10,347,617 B2
APPLICATION NO. : 15/695198
DATED : July 9, 2019
INVENTOR(S) : Lawrence A. Clevenger et al.

It is certified that error appears in the above-identified patent and that said Letters Patent is hereby corrected as shown below:

On the Title Page

Item (73) Insert the following assignee under International Business Machines Corporation, Armonk, NY (US):
--STMicroelectronics, Inc. Coppell, TX (US)--

Signed and Sealed this
Third Day of March, 2020

Andrei Iancu
*Director of the United States Patent and Trademark Office*